July 6, 1965 K. A. BICKEL ETAL 3,193,166

COMPONENT INSERTION APPARATUS

Filed Aug. 12, 1963 3 Sheets-Sheet 1

INVENTORS
K. A. BICKEL
R. E. HOTZE
J. B. KREPP

BY S. Gundersen
ATTORNEY

COMPONENT INSERTION APPARATUS

Filed Aug. 12, 1963 3 Sheets-Sheet 2

July 6, 1965 K. A. BICKEL ETAL 3,193,166

COMPONENT INSERTION APPARATUS

Filed Aug. 12, 1963 3 Sheets-Sheet 3

United States Patent Office 3,193,166

Patented July 6, 1965

3,193,166

COMPONENT INSERTION APPARATUS

Kent A. Bickel, Gahanna, Robert E. Hotze, Westerville, and James B. Krepp, Reynoldsburg, Ohio, assignors to Western Electric Company, Incorporated, New York, N.Y., a corporation of New York Filed Aug. 12, 1963, Ser. No. 301,547
17 Claims. (Cl. 227—85)

This invention relates to apparatus for inserting electrical components into printed circuit boards and particularly relates to apparatus for gripping and supporting the axially extended leads of the components during subsequent shearing, forming, inserting and clinching operations.

In the assembly of electrical components with printed circuit boards, the handling of fragile leads which extend axially from the electrical components is extremely critical due to the stresses applied to the leads adjacent to the body during the shearing and forming of the leads and the subsequent carrying and insertion of the leads into the printed circuit boards. Further, during the clinching operation, whereby the ends of the formed leads are clinched beneath the printed circuit board, an additional stress is experienced by the leads adjacent to the component body.

Facilities used in the past provided a means for gripping the component leads during shearing and forming operations; however, the removal of the gripping means was necessitated by the transfer of the component during subsequent operations involving the insertion of the leads of the component into a printed circuit board and the securing by clinching of the leads beneath the board. Thus, it is obvious that there is a need for a means for preventing or minimizing any stress upon the leads adjacent to the component body during any subsequent forming and clinching operations.

It is, therefore, an object of this invention to provide apparatus for engaging and gripping the leads adjacent to the component body during a shearing and forming operation upon the leads extending from the component body and for further holding the leads adjacent to the component body to prevent stress upon the leads during a subsequent securing operation.

Another object of the invention is the provision of apparatus for gripping and carrying the component leads with the component attached thereto for subsequent insertion into a printed circuit board.

With these and other objects in view, the present invention contemplates means for gripping and supporting axially extended leads adjacent to a component body and for holding the leads during subsequent shearing, forming, inserting and clinching operations.

The gripping means grips the leads adjacent to the component body and supports the leads during a shearing and forming operation, whereby the leads adjacent to the component body are prevented from being subjected to stresses during these operations by the gripping action. Thereafter, the gripping means supports and carries the component with the formed leads toward a printed circuit board and inserts the formed leads into the board. The gripping means further supports the component leads during a subsequent securing operation, such as clinching, thereby further preventing stress upon the leads adjacent the component body.

Other objects and advantages of the invention will be more readily understood from the detailed description of apparatus for forming specific embodiments thereof when read in conjunction with the appended drawings in which.

Figure 1:
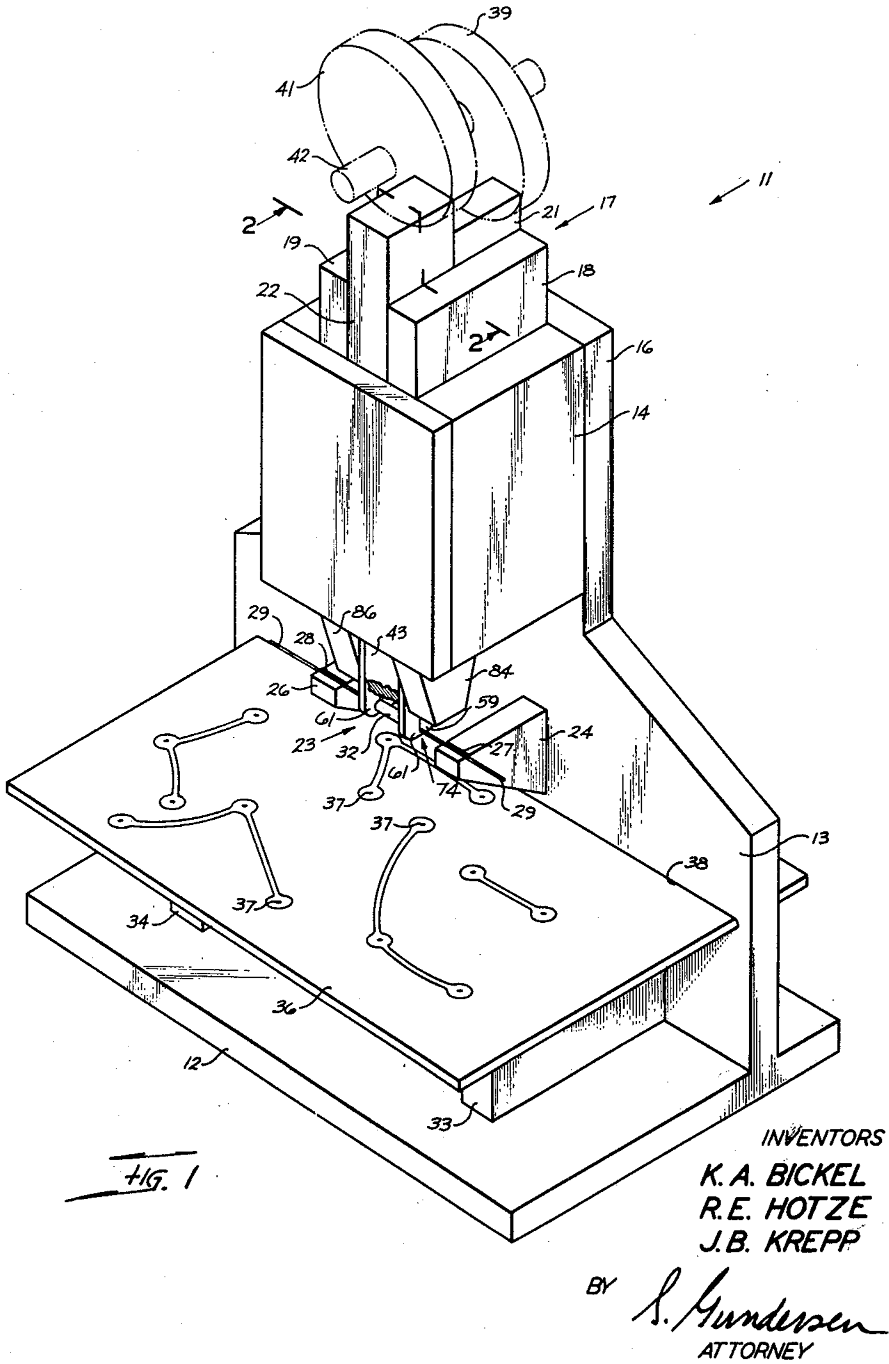
FIG. 1 is a perspective view showing component insertion apparatus with the relative positioning of component with the elements for forming and inserting the leads of the component into a printed circuit board.

As shown in FIG. 1, a component insertion apparatus, generally designated by the reference numeral 11, is provided with a horizontal platform 12 which supports a vertical stand 13. A housing 14 extends from an upper portion 16 of the stand 13 and slidably supports a slidable shearing and forming block, generally designated by the reference numeral 17, wherein the block is provided with a pair of spaced shearing and forming slides 18 and 19 which are longitudinally and integrally formed with a spacing web 21 which extends upwardly from the uppermost portion of the slides and which occupies a portion of the space formed between the slides. An upper slide block 22 is slidably positioned within the remaining space between the shear slides 18 and 19 and supports sets of gripping devices, generally designated by the reference numeral 23, which extend downwardly therefrom. A pair of spaced anvil platforms 24 and 26 extend laterally from the vertical stand 13 spacially beneath the housing 14 and are formed with aligned slots 27 and 28, respectively, for receiving and supporting the axially extended leads 29 of an electrical component 32. A pair of upright supports 33 and 34 extend upwardly from the horizontal platform 12 and support a printed circuit board 36 having a plurality of apertures 37 therein for receiving the leads 29 subsequent to the forming thereof. The vertical stand 13 is formed with a transverse slot 38 for permitting movement of the printed circuit board 36 to facilitate subsequent alignment of the board for the insertion of the formed component leads 29 into the apertures 37 of the board. A pair of cams 39 and 41 (shown in phantom) are attached to a shaft 42 for rotation therewith, whereby the rotational movement for the shaft is provided by a motor (not shown). During the operation of the apparatus 11, the cams 39 and 41 are rotated to slidably urge the blocks 21 and 22, respectively, within the housing 14 to accomplish the gripping, shearing, forming and inserting operations.

Figure 2:
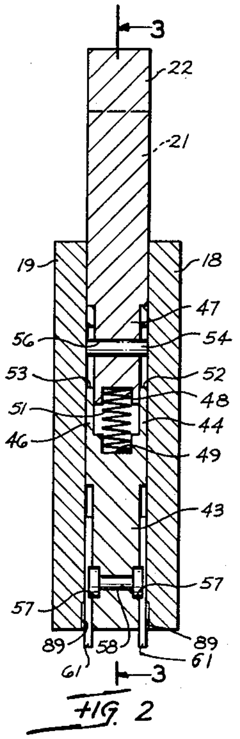
FIG. 2 is a sectional view taken along line 2—2 of FIG. 1 showing the relative orientation of gripping and forming elements utilized in the component insertion apparatus.
Figure 3:
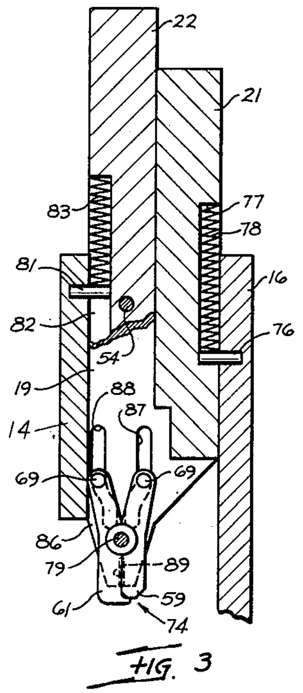
FIG. 3 is a sectional view taken along line 3—3 of FIG. 2 with parts broken away for clarity showing the relative cooperation between the gripping and forming elements for maintaining gripping action during the entire cycle of subsequent shearing, forming, inserting and clinching operations.
Figure 4:
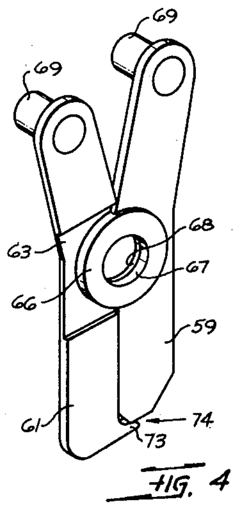
FIG. 4 is a perspective view showing one pair of lead-gripping fingers showing a nest for receiving the leads and further showing pins at the opposite ends of the fingers for camming the fingers to a gripping position.
Figure 5:
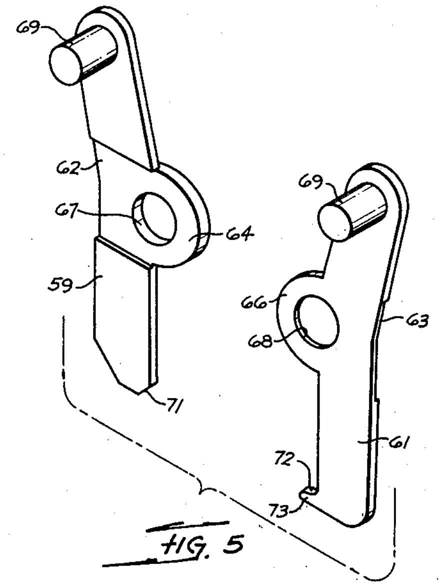
FIG. 5 is a perspective view showing the pair of lead-clamping fingers in separation.
Figure 6:
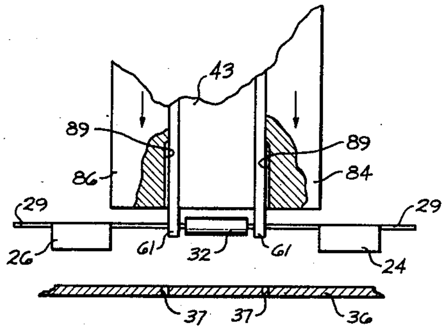
FIGS. 6 through 9 are diagrammatical views showing step-by-step operation of the gripping, shearing, forming, inserting and clinching operations.
Figure 7:
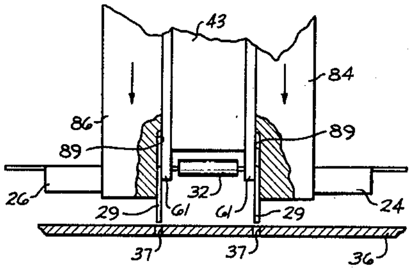
Figure 8:
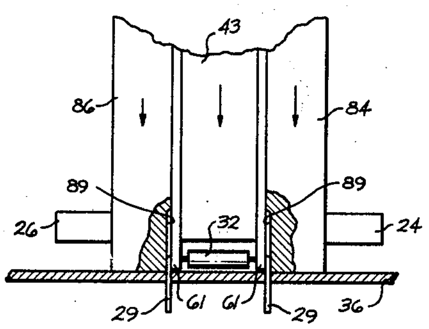
Figure 9:
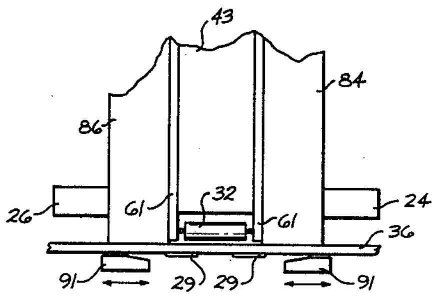

Referring now to FIG. 2, the shear slides 18 and 19 define a space therebetween which slideably supports the upper slide block 22 in the upper portion thereof. A finger support block 43 is slideably positioned in the lower portion of the space defined by the shear slides 18 and 19 and is formed with upwardly extending bifurcations 44 and 46 which define a space therebetween for receiving a lower reduced portion 47 of the upper slide block 22. The lower end of the reduced portion 47 of the slide block 22 and the upper end of the finger support block 43 are formed with recesses 48 and 49, respectively, for receiving a compression spring 51 therebetween, thereby normally urging apart the blocks 22 and 43, and further providing resilient compressing action during the lead-gripping operation. In addition, the bifurcations 44 and 46 are provided with aligned slots 52 and 53, respectively, for receiving the ends of a pin 54 which is fixedly positioned within an aperture 56 formed transversely in the slide block 22. Thus, the compression spring 51 normally urges apart the blocks 22 and 43 but the pin 54 cooperates with the slots 52 and 53 to prevent the block 22 from moving upwardly and out of the space defined between the shear slides 18 and 19. However, the ends of the pin 54 are permitted to slide within the slots 52 and 53, thereby allowing relative movement between the block 22 and the block 43. Additionally, the finger support block 43 is formed with a pair of counterbores 57 on opposite sides thereof contiguous with a transverse bore 58 axially aligned with and interconnecting the bores 57. As shown in FIGS. 4 and 5, a pair of gripping fingers 59 and 61 of the gripping device 23 is each formed with transverse slots 62 and 63, respectively, intermediate the ends thereof. The slots 62 and 63 are formed to receive arcuate extensions 64 and 66, respectively, of opposing fingers 59 and 61. Further, the arcuate extensions 64 and 66 are formed with circular openings 67 and 68, respectively, which are aligned when the fingers 59 and 61 are positioned for gripping engagement with the leads 29. The uppermost portion of each of the fingers 59 and 61 are provided with a pin 69 which extends perpendicularly therefrom. Further, the upper portion of each of the fingers 59 and 61 extend upwardly and away from the arcuate extensions 64 and 66, respectively, to facilitate the opening of the gripping fingers. In the open position, the opposing edges of the upwardly extending portions of the fingers 59 and 61 are in flush engagement, thereby facilitating the spreading of the lower portion of the fingers. The lowermost corner of the finger 59, which is opposite the finger 61, is formed with a bevelled surface 71 and mates with a corner 72 formed by an outwardly turned projection 73 on the finger 61. The mating of the surface 71 of the finger 59 with the corner 72 of the finger 61 forms a nest 74 (FIGS. 1 and 4) for receiving and gripping the axially extended leads 29 of the component 32. As shown in FIG. 2, the two sets of opposed fingers 59 and 61 are positioned so that the circular openings 67 and 68 of each set of fingers are axially aligned with the bore 58 and the counterbore 57. Thereafter, a pin 79 is positioned through the aligned openings and bores, thereby attaching the sets of fingers to the finger support block 43 for pivotal movement with respect thereto. Referring now to FIG. 3, a pin 76 is fixedly attached to the upper portion 16 of the vertical stand 13 and extends into a slot 77 formed in the spacing web 21. A compression spring 78 is positioned with the slot 77 between the pin 76 and the uppermost surface of the slot wall, thereby normally urging upwardly the spacing block 21 and the shearing and forming slides 18 and 19. Further, a pin 81 is fixedly attached to the front plate of the housing 14 and extends into a slot 82 formed in the slide block 22. A compression spring 83 is positioned within the slot 82 between the pin 81 and the upper surface of the slot to normally urge upwardly the block 22. The lowermost portion of the shearing and forming slides 18 and 19 are tapered inwardly to form blades 84 and 86, respectively. Each of the shearing and forming slides 18 and 19 are formed intermediate the vertical ends thereof with a pair of spaced cam slots 87 and 88 in the surface adjacent to the finger support block 43 and are further positioned to receive therein the pins 69 of the fingers 59 and 61. The cam slots 87 and 88 are spaced apart a predetermined distance at the upper ends thereof, extend downwardly in a parallel fashion, curve inwardly towards each other at a predetermined distance from the top, and thereafter assume a continued downward predetermined parallel spacing to the lower ends thereof wherein the lower end spacing is less than the spacing at the upper ends. In addition, the opposed surfaces of the blades 84 and 86 are formed with vertical forming slots 89 for engaging and bending the extended portion of the leads 29 to bend the leads downwardly about the gripping fingers 59 and 61. Thus it is seen that upon relative movement between the finger support 43 and the slides 18 and 19, the pins are guided within the cam slots 87 and 88 formed in each of the slides 18 and 19 and are thereby pivoted about the pin 79 in accordance with the operation at any given instant. Further, the gripping device 23 also functions as an anvil during the forming operation as well as a means to prevent stresses upon the leads 29 in the area where the leads are joined with the body of the component 32.

As shown in FIGS. 6 through 9, the electrical component 32 is positioned so that the leads 29, extending axially therefrom, are positioned in the grooves of the anvil platforms 24 and 26. Thereafter, the cam 41 engages the upper slide block 22 and urges the block downwardly between the shearing and forming slides 18 and 19. As the slide block 22 is urged downwardly, a downward force is transmitted to the finger support block 43 through resilient action of the compression spring 51, thereby urging the pins 69 of the fingers 59 and 61 through the cam slots 87 and 88 of the presently stationary shearing and forming slides 18 and 19. As the fingers 59 and 61 move downwardly, the lower portions of the fingers are spread apart substantially and are positioned adjacent to those portions of the leads 29 adjacent to the body of the component 32. Thereafter, the cam 39 engages the upper surface of the spacing web 21 to urge the web downwardly, thereby urging the slides 18 and 19 downwardly. At this point, the downward vertical movement of the sets of fingers 59 and 61 ceases and the pins 69 thereof are guided by the moving cam slots 87 and 88 so that the lower portions of the fingers are pivoted inwardly and the portions of the leads 29 adjacent to the component 32 are gripped within the nest 74 formed by the bevelled surface 71 of the finger 59 and the inwardly turned projection 73 of the finger 61. Thereafter, the cam 49 continues to urge the spacing web 21 downwardly while the sets of fingers 59 and 61 are maintained in a relatively stationary vertical position. As the shearing and forming blades 84 and 86 move downwardly (FIG. 7) by the action of the cam 39 upon the web 21, the lowermost portions of the blades engage the portions of the axially extended leads 29 between the respective pairs of fingers 59 and 61 and the anvil platforms 24 and 26, respectively, thereby cooperating with the anvil platforms 24 and 26 to shear extended end portions of the leads 29 and to further bend and form into the forming grooves 89 the remaining portion of the leads extending from the fingers. It is particularly noted that each pair of the gripping fingers 59 and 61 function as an anvil during the forming of the leads 29 within the grooves 89 of the forming blades 84 and 86. Subsequently, the cams 39 and 41 cooperate to urge the shearing and forming blades 84 and 86 and the respective pairs of fingers 59 and 61 downwardly together (FIG. 8) whereby the component 32 with the formed leads 29 is continuously gripped by the original gripping action of the fingers and carried to the printed circuit board 36 for the insertion operation. Thereafter, the shearing and forming blades 84 and 86 engage the upper surface of the printed circuit board 36 and the finger-support block 43 continues downwardly to insert the continuously gripped, formed leads into the apertures 37 of the printed circuit board. As the fingers 59 and 61 approach the board, the downward movement therefor provided by the cam 41 ceases thereby positioning the lowermost portions of the fingers slightly above the board. Thereafter, clinching arms 91 (FIG. 9), which are positioned beneath the printed circuit board 36 are actuated by a source (not shown) to bend the ends of the leads 29 extending beneath the board toward each other, thereby clinching the component 32 to the board. Subsequent to the clinching operation, the cam 39 allows the spacing web 21 to be urged upwardly under the biasing action of the compressed spring 78. As the web 21 is urged upwardly, the cam slots 87 and 88 slide along the pins 69 of the respective fingers 59 and 61, whereupon the lower portions of the respective fingers 59 and 61 are urged apart to release the gripped leads 29 adjacent to the component 32. Continued rotation of the shaft 42 positions the cam 41 so that the upper slide block 22 is urged upwardly due to the biasing action of the compressed spring 83 whereby the insertion apparatus 11 returns to a normal position of rest. Thus it is seen that each pair of the gripping fingers 59 and 61 grip the axially extended leads 29 adjacent to the component body 32 prior to the shearing operation and maintain such gripping action during the entire cycle of operation, including the shearing, forming, inserting and clinching operation. In this manner, the need for a separate anvil during the shearing and forming operations are obviated and the necessity for releasing the gripped leads prior to the initiation of the insertion cycle is overcome.

It is to be understood that the above-described arrangement is simply illustrative of the principles of the invention. Other arrangements may be devised by those skilled in the art which will embody the principles of the invention and fall within the spirit and scope thereof.

What is claimed is:

1. Apparatus for inserting the axially extended leads of an electrical component body into printed circuit boards, which comprises:

means for gripping each of the axially extended leads adjacent the component body, means for forming about the gripping means the portion of the leads extending from the gripping means, means for moving the gripping and forming means with the component and formed leads toward the printed circuit board and for inserting the formed leads into apertures of the printed circuit board, and means for moving the gripping means into gripping engagement with the leads adjacent the component body and for retaining the gripping means in gripping engagement with the leads as the leads of the component are formed and inserted into the printed circuit board, whereby any stresses exerted upon the portion of the leads extending from the gripping means is prevented from appearing at the juncture of the leads and the component body.

2. The apparatus of claim 1, wherein the means for gripping each of the leads comprises:

a pair of opposed fingers pivotally attached to each end of a common support shaft intermediate the ends of the fingers where a nest is formed at one common end of the fingers for receiving and gripping the wire elements therebetween.

3. The apparatus of claim 2, wherein the nest is formed by a bevelled surface on a corner of one finger mating with a corner projection extending from the opposite finger.

4. The apparatus of claim 1, wherein the means for moving the gripping means comprises:

a pair of slides adjacent to the gripping means, each slide formed with cam surfaces adjacent to the gripping means, means attached to the gripping means for engaging the cam surfaces, and means for moving the slides relative to the gripping means, whereby the cam surfaces of the slides move the cam-engaging means so that the gripping means is moved into a gripping position.

5. The apparatus of claim 4, wherein the cam surfaces formed in the slides are spaced cam slots which diverge upwardly.

6. The apparatus of claim 4, wherein the engaging means attached to each finger comprises a pin extending perpendicularly from the upper end thereof.

7. The apparatus of claim 1, wherein the retaining portion of the means for moving and retaining the gripping means comprises:

a pair of slides adjacent to the gripping means, each slide formed with a pair of spaced parallel cam slots adjacent to the gripping means, and cam pins attached to and extending from the gripping means and into the cam slots of the slide during the gripping of wire elements, whereby the gripping action is sustained during relative and common movement of the slides and gripping means so that any stresses exerted upon the extended ends of the wire elements are prevented from appearing on the respective junctures of the elements and the common body.

8. Apparatus for inserting axially extended leads of electrical components into printed circuit boards, which comprises:

means for supporting the axially extended ends of leads of the electrical component, means for gripping the axially extended leads adjacent to the component body, means for shearing the ends of the extended leads adjacent to the supporting means, means for forming about the gripping means the portion of the leads extending from the gripping means, means for moving the gripping and forming means with the component and formed leads toward the printed circuit board and for inserting the formed leads into apertures of the printed circuit board, means for clinching the extended portions of the formed leads beneath the printed circuit board, and means for moving the gripping means into gripping engagement with the leads adjacent to the component body prior to the shearing operation and for retaining the gripping means in gripping engagement with the leads as the leads of the component are sheared, formed, inserted and clinched beneath the printed circuit board, whereby any stresses exerted upon the portion of the leads extending from the gripping means is prevented from appearing at the juncture of the leads and the component body.

9. Apparatus for inserting axially extended leads of electrical components into printed circuit boards, which comprises:

means for supporting the axially extended ends of leads of the electrical component, a support, a pair of opposed fingers attached for pivotal movement on each of two sides of the support, wherein the spacing between the pairs of fingers at opposite sides of the support is substantially equal to the length of the component body, whereby the pairs of fingers grip the leads adjacent to the component body upon pivotal movement of the fingers, means for shearing the ends of the extended leads adjacent to the supporting means, means for forming about the gripping fingers the portion of the leads extending from the gripping fingers, means for moving the support with the fingers and the forming means and carrying the formed leads and component toward the printed circuit board and for inserting the formed leads into apertures of the printed circuit board, means for clinching the extended portions of the formed leads beneath the printed circuit board, and means for moving the gripping fingers into gripping engagement with the leads adjacent to the component body prior to the shearing operation and for retaining the gripping fingers in gripping engagement with the leads as the leads of the component are sheared, formed, inserted and clinched beneath the printed circuit board, whereby any stresses exerted upon the portion of the leads extending from the gripping fingers are prevented from appearing at the juncture of the leads and the component body.

10. The apparatus of claim 9, wherein the means for moving the gripping fingers into gripping engagement with the leads and for retaining the fingers in gripping engagement with the leads comprises:

a pair of slides on opposite sides of the support adjacent to the fingers for sliding movement relative to the support, each slide formed with a pair of spaced slots adjacent to the fingers, a lower portion of the spaced slots diverging upwardly, an upper portion of the spaced slots being parallel and communicating with the upper ends of the upwardly diverging slots, a pin attached to and projecting perpendicularly from the upper end of each finger, the pins extending from the fingers into the lower portion of the diverging slots when the fingers are adjacent to the leads in an open position, means for moving the slides downwardly relative to the fingers whereby the pins are guided relatively upwardly through the diverging slots to pivot the fingers into gripping engagement with the leads adjacent to the component body, and means for moving the slides and support together and relatively during the shearing, forming, transfer, inserting and clinching operations whereby the pins are guided through the parallel slots to retain the fingers in gripping engagement with the leads.

11. Apparatus for inserting axially extended leads of electrical components into printed circuit boards, which comprises:

a pair of spaced anvil platforms for receiving and supporting the ends of the axially extended leads of the component, a housing, a support slideably mounted within the housing intermediate the space between the anvil platforms, a shaft mounted transversely within the support having ends extending from opposite sides of the support, a pair of opposed fingers mounted intermediate the ends thereof on each of the ends of the shaft for pivotal movement thereabout, one finger of each pair formed with a bevelled corner surface and the other finger of each pair provided with a projection forming a corner which mates with the bevelled corner surface of the opposing finger to receive and grip the component leads therebetween, a pair of slides positioned on opposite sides of the support and within the spaces formed between the respective pairs of fingers and the anvil platforms, the lower surface of each slide adjacent to the anvil platforms formed with a shearing edge cooperating with the anvil platform to shear the component lead upon movement of the slide, each slide formed with a forming slot for forming the leads about the projection of the fingers, each slide formed with a pair of camming slots adjacent to the fingers, a pin projecting perpendicularly from the upper end of each finger and extending into the camming slots of the adjacent slide, the slots being parallel and spaced a predetermined distance along the upper portions thereof and converging downwardly along intermediate portions thereof, and further being parallel and spaced a lesser distance apart along the lower portions thereof, means for moving the support with the fingers downwardly, whereby the pins are guided downwardly through the converging portion of the camming slots so that the gripping fingers are pivoted to an open position adjacent to the component leads, means for moving the slides downwardly, whereby the pins are guided relatively upwardly through the downwardly converging portion of the slots in a diverging manner and into the parallel spaced upper portion of the camming slots, whereby the gripping fingers are positioned tightly about the leads adjacent to the component body and whereby the continued downward movement of the slides shears the extended leads adjacent to the anvil platforms and forms substantially the remaining portion of the leads about the projections of the fingers, the pins of the fingers extending into the parallel spaced upper portion of the fingers during the shearing and forming operations to prevent any stresses exerted on the ends of the leads from appearing at the juncture of the component body and the leads, means for moving the slides and the finger support downwardly toward a printed circuit board, whereby the lower portions of the slide engage the board, means for moving downwardly the finger support slideably between the slides, whereby the extended formed ends of the component are inserted into apertures of the printed circuit board and the pins slide downwardly within the parallel spaced upper portion of the camming slots, thereby retaining the gripping action of the fingers, and means for clinching the fingers beneath the board, whereby the gripping action of the fingers remains in gripping engagement with the leads adjacent to the component body so that any stresses exerted upon the portions of the leads extending from the gripping fingers are prevented from appearing at the juncture of the leads and the component body.

12. Apparatus for inserting axially extended leads of electrical components into printed circuit boards, which comprises:

means for supporting the axially extended ends of leads of the electrical component, a housing, a support slidably mounted within the housing, a pair of fingers attached to each of two opposite sides of the support for pivotal movement thereabout and movement therewith relative to the housing, opposing edges of opposite fingers of each pair formed with mating surfaces providing a nest for receiving and gripping the axially extended leads adjacent to the component body, means for positioning the pairs of fingers in an open position adjacent to the axially extended leads adjacent to the component body, means for pivoting the pairs of open fingers into gripping engagement with the extended leads adjacent to the component body, whereby subsequent stresses exerted on the extended ends of the leads are prevented from appearing at the juncture of the leads and the component body, means for shearing the ends of the extended leads adjacent to the supporting means, means for forming about the gripping fingers the portion of the leads extending from the gripping fingers, means for moving the gripping fingers and forming means with the component and formed leads toward the printed circuit board and for inserting the formed leads into apertures of the printed circuit board, means for clinching the extended portions of the formed leads beneath the printed circuit board, and means for retaining the pairs of fingers in gripping engagement with the extended leads adjacent to the component body when the component is transferred to the printed circuit board and the leads thereof are inserted through and clinched beneath the board, where any stresses exerted upon the leads during these operations are prevented from appearing at the juncture of the leads and the component body.

13. The apparatus of claim 12, wherein the means for positioning the fingers in an open position comprises:

a pair of slides positioned for sliding movement within the housing adjacent to each pair of fingers, each slide formed with cam surfaces adjacent to each pair of fingers, cam guides attached to the pairs of fingers in engagement with the cam surfaces of the slides, and means for moving the pairs of fingers downwardly relative to the slides, whereby the cam guides of the fingers are moved along the cam surfaces of the slides to pivot the fingers to an open position adjacent to the extended leads.

14. The apparatus of claim 13, wherein the cam surfaces of the slides are spaced, downwardly converging slots formed in the slides adjacent to the fingers, and the cam guides of the fingers are pins projecting perpendicularly from each finger into respective slots of the slides.

15. The apparatus of claim 12, wherein the means for pivoting the fingers into gripping engagement with the leads comprises:

a pair of slides on opposite sides of the support, each slide formed with spaced, upwardly diverging slots, pins projecting perpendicularly from each of the fingers into respective slots of the slides, the pins resting in the lower portion of the upwardly diverging slots, whereby the gripping fingers are in an open position adjacent to the extended leads, and means for moving the slides downwardly, whereby the pins follow the diverging slots to the upper limits thereof so that the fingers are pivoted into gripping engagement with the extended leads adjacent to the component body.

16. The apparatus of claim 12, wherein the means for retaining the fingers in gripping engagement with the component leads when the component is transferred and the leads are inserted into and clinched beneath the board comprises:

a pair of slides on opposite sides of the support, each slide formed with cam surfaces adjacent to the pairs of fingers, cam guides attached to the fingers in engagement with the cam surfaces of the slides, whereby the cam guides of the fingers move relatively along the cam surfaces of the slides to retain the fingers in a gripping position.

17. The apparatus of claim 16, wherein the cam surfaces of each slide are parallel slots formed in the slides adjacent to the fingers and spaced apart a predetermined distance, and the cam guides are pins projecting perpendicularly from the fingers into the respective slots of the slides when the fingers are in a gripping position.

References Cited by the Examiner

UNITED STATES PATENTS

| | | | |
|---|---|---|---|
| 2,855,016 | 10/58 | Crosby et al. | 1—321 X |
| 2,885,681 | 5/59 | Dater | 1—187 |

GRANVILLE Y. CUSTER, Jr., *Primary Examiner.*